US009245854B2

(12) United States Patent
Brodsky et al.

(10) Patent No.: US 9,245,854 B2
(45) Date of Patent: Jan. 26, 2016

(54) ORGANIC MODULE EMI SHIELDING STRUCTURES AND METHODS

(71) Applicant: International Business Machines Corporation, Armonk, NY (US)

(72) Inventors: William L. Brodsky, Binghamton, NY (US); Timothy W. Budell, Milton, VT (US); Samuel R. Connor, Apex, NC (US); Mark Curtis Hayes Lamorey, South Burlington, VT (US); Janak G. Patel, South Burlington, VT (US); Peter Slota, Jr., Vestal, NY (US); David B. Stone, Jericho, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/515,597

(22) Filed: Oct. 16, 2014

(65) Prior Publication Data

US 2015/0033554 A1    Feb. 5, 2015

Related U.S. Application Data

(62) Division of application No. 13/752,737, filed on Jan. 29, 2013, now Pat. No. 8,952,503.

(51) Int. Cl.
*H01L 23/552* (2006.01)
*H01L 23/29* (2006.01)
(Continued)

(52) U.S. Cl.
CPC .......... *H01L 23/552* (2013.01); *H01L 23/295* (2013.01); *H05K 3/284* (2013.01);
(Continued)

(58) Field of Classification Search
CPC .......... H01L 2924/00014; H01L 2924/00013; H01L 23/552; H01L 2924/3025
USPC .................................................. 257/659, 660
See application file for complete search history.

(56) References Cited

U.S. PATENT DOCUMENTS 5,639,989 A    6/1997 Higgins, III
5,763,824 A    6/1998 King et al.
(Continued)

FOREIGN PATENT DOCUMENTS

WO    WO2013159307    * 10/2013    ........ H01L 23/49894

OTHER PUBLICATIONS

Office Action Communication, U.S. Appl. No. 13/752,737, Dated Jan. 9, 2014, pp. 1-9.
(Continued)

*Primary Examiner* — Cuong Q Nguyen
*Assistant Examiner* — Nishath Yasmeen
(74) *Attorney, Agent, or Firm* — Gibb & Riley, LLC; David A. Cain, Esq.

(57) ABSTRACT

Apparatus and methods for an electronic package incorporating shielding against emissions of electromagnetic interference (EMI). According to an integrated circuit structure, a substrate is on a printed circuit board. An integrated circuit chip is on the substrate. The integrated circuit chip is electrically connected to the substrate. An EMI shielding unit is on the integrated circuit chip and the substrate. The EMI shielding unit comprises a lid covering the integrated circuit chip and portions of the substrate outside the integrated circuit chip. A fill material can be deposited within a cavity formed between the lid and the substrate. The fill material comprises an EMI absorbing material. A periphery of the lid comprises a side skirt, the side skirt circumscribing the integrated circuit chip and the substrate. EMI absorbing material is on the printed circuit board, and a portion of the side skirt is embedded in the EMI absorbing material.

18 Claims, 7 Drawing Sheets

(51) Int. Cl.
*H05K 3/28* (2006.01)
*H05K 9/00* (2006.01)
*H01L 21/50* (2006.01)
*H01L 23/31* (2006.01)
*H01L 23/053* (2006.01)

(52) U.S. Cl.
CPC ............ *H05K 9/0081* (2013.01); *H01L 21/50* (2013.01); *H01L 23/053* (2013.01); *H01L 23/3128* (2013.01); *H01L 2224/131* (2013.01); *H01L 2224/16225* (2013.01); *H01L 2224/16227* (2013.01); *H01L 2224/32245* (2013.01); *H01L 2224/73253* (2013.01); *H01L 2924/14* (2013.01); *H01L 2924/15311* (2013.01); *H01L 2924/167* (2013.01); *H01L 2924/1676* (2013.01); *H01L 2924/16172* (2013.01); *H01L 2924/16178* (2013.01); *H01L 2924/16179* (2013.01); *H01L 2924/16793* (2013.01); *H01L 2924/16798* (2013.01); *H01L 2924/19041* (2013.01); *H01L 2924/19105* (2013.01); *Y10T 29/49128* (2015.01)

(56) References Cited

U.S. PATENT DOCUMENTS

| | | | |
|---|---|---|---|
| 5,939,784 A * | 8/1999 | Glenn | ............... H03H 9/0585 257/678 |
| 6,215,373 B1 | 4/2001 | Novak et al. | |
| 6,512,675 B1 | 1/2003 | Tarter et al. | |
| 6,515,870 B1 | 2/2003 | Skinner et al. | |
| 6,518,660 B2 | 2/2003 | Kwon et al. | |
| 6,573,590 B1 | 6/2003 | Radu et al. | |
| 6,727,774 B1 | 4/2004 | Novak | |
| 6,740,959 B2 | 5/2004 | Alcoe et al. | |
| 6,818,821 B2 | 11/2004 | Fujieda et al. | |
| 6,834,380 B2 | 12/2004 | Khazei | |
| 6,856,007 B2 | 2/2005 | Warner | |
| 6,865,084 B2 | 3/2005 | Lin et al. | |
| 6,867,480 B2 | 3/2005 | Legaspi, Jr. et al. | |
| 7,145,084 B1 | 12/2006 | Sarihan et al. | |
| 7,173,329 B2 | 2/2007 | Frutschy et al. | |
| 7,190,053 B2 | 3/2007 | Orth et al. | |
| 7,239,261 B2 | 7/2007 | Fujieda et al. | |
| 7,248,483 B2 | 7/2007 | West | |
| 7,560,825 B2 | 7/2009 | Crawley | |
| 7,576,415 B2 | 8/2009 | Cha et al. | |
| 7,620,453 B1 | 11/2009 | Propato et al. | |
| 7,829,981 B2 | 11/2010 | Hsu | |
| 7,852,125 B2 | 12/2010 | Lopez et al. | |
| 7,989,928 B2 | 8/2011 | Liao et al. | |
| 7,999,359 B2 | 8/2011 | Wu | |
| 8,013,404 B2 | 9/2011 | Zhe et al. | |
| 8,022,511 B2 | 9/2011 | Chiu et al. | |
| 8,030,750 B2 | 10/2011 | Kim et al. | |
| 8,106,539 B2 | 1/2012 | Schatz et al. | |
| 8,138,024 B2 | 3/2012 | Do et al. | |
| 8,138,563 B2 | 3/2012 | Cho et al. | |
| 8,212,339 B2 | 7/2012 | Liao et al. | |
| 8,242,602 B2 | 8/2012 | Fitzgerald et al. | |
| 2005/0184405 A1* | 8/2005 | Bai | ..................... H01L 23/295 257/787 |
| 2009/0302436 A1* | 12/2009 | Kim | ..................... H01L 21/561 257/659 |
| 2010/0013064 A1 | 1/2010 | Hsu | |
| 2011/0115059 A1 | 5/2011 | Lee et al. | |
| 2011/0304015 A1* | 12/2011 | Kim | ..................... H01L 23/552 257/532 |
| 2012/0243199 A1 | 9/2012 | Wu | |

OTHER PUBLICATIONS

Office Action Communication, U.S. Appl. No. 13/752,737, Dated Feb. 14, 2014, pp. 1-19.
Office Action Communication, U.S. Appl. No. 13/752,737, Dated Jun. 5, 2014, pp. 1-19.
Advisory Action Communication, U.S. Appl. No. 13/752,737, Dated Aug. 29, 2014, pp. 1-3.
Notice of Allowance Communication, U.S. Appl. No. 13/752,737, Dated Oct. 1, 2014, pp. 1-16.

* cited by examiner

ORGANIC MODULE EMI SHIELDING STRUCTURES AND METHODS

CROSS-REFERENCE TO RELATED APPLICATIONS

This application is a divisional of U.S. patent application Ser. No. 13/752,737, filed Jan. 29, 2013, the complete disclosure of which is incorporated herein by reference.

BACKGROUND

The present disclosure relates to electronics packages incorporating EMI shielding. More particularly, the disclosure relates to semiconductor devices that incorporate integrated circuit chip-carrier structures having grounded shields embedded therein and which are adapted to reduce EMI emissions for electronic packages.

In carrying out the production of electronic packages, particularly such as semiconductor devices that incorporate chip carriers or substrates of either laminates or organic materials or ceramics and the like, and which support one or more integrated circuit chips that are covered by a heat-dissipating lid or cap structure, the reliable functioning thereof is potentially adversely affected due to encountered electromagnetic interference (EMI), requiring that an EMI shield be provided to counteract and eliminate the adverse effects thereof. Moreover, the EMI shielding is intended to function also as an emission shield; in effect, to inhibit or stop outgoing EMI energy. Quite frequently, such semiconductor devices may comprise a substrate providing for electrical connections to one or more integrated circuit chips positioned thereon, and whereby a heat-dissipating structure; for instance, such as a heat spreader in the form of a cap or lid is, in turn, arranged above the chip or chips and in thermally-conductive mechanical adhesive connection therewith.

Organic laminate packages are used to fabricate modules that can be used in computers and data processing equipment. In these applications, EMI can cause computation errors in electrical circuits, so there is a desire to control radiation that is emitted from a module. Depending on the application and/or location of the system installation, there can be government regulations that also have to be met. Based on this, it is preferred that EMI be controlled as close to the source as possible, i.e., at the module.

Various electrical components and interconnects are normally provided on both sides of the substrates in electrical communication with the chip or chips, as is well known in the semiconductor or electronic packaging technology. In order to effectively screen out any encountered EMI during operation of the semiconductor devices, it has been proposed to provide structure extending about the chip and interposed between the heat-dissipating lid structure or cap, and also the substrate, in that suitable connections or wiring is to be provided, thereby creating an EMI shield for the semiconductor device or electronic package. In this connection, numerous types of EMI shields or similar types of EMI protective structures for the electronic packages or semiconductor devices have been proposed in the technology, possessing varying degrees of efficacy in protecting or shielding the devices from electromagnetic interference (EMI).

SUMMARY

According to an integrated circuit structure, a substrate is on a printed circuit board. The substrate has a first surface and a second surface and electromagnetic interference (EMI) absorbing material on at least a portion of at least one of the first surface and the second surface of the substrate. An integrated circuit chip is on the substrate. The integrated circuit chip is electrically connected to the substrate. An EMI shielding unit is on the integrated circuit chip and the substrate. The EMI shielding unit comprises a lid covering the integrated circuit chip and portions of the substrate outside the integrated circuit chip. A periphery of the lid comprises a side skirt, the side skirt circumscribing the integrated circuit chip and the substrate. EMI absorbing material is on the printed circuit board, and a portion of the side skirt is embedded in the EMI absorbing material.

According to an electronics package herein, a substrate has a first surface and a second surface opposite the first surface. An integrated circuit chip is on the first surface of the substrate. A plurality of electrically conductive circuit members is on the first surface of the substrate. The electrically conductive circuit members are electrically connected to the integrated circuit chip. The electronic package includes a printed circuit board having a mounting surface. The second surface of the substrate is connected to the mounting surface of the printed circuit board. A lid covers the integrated circuit chip and portions of the substrate outside the integrated circuit chip. A periphery of the lid comprises a side skirt circumscribing the integrated circuit chip and the substrate. Electromagnetic interference (EMI) absorbing material is on the printed circuit board, and a portion of the side skirt is embedded in the EMI absorbing material.

According to a method herein, an integrated circuit chip is connected to a substrate. The substrate has a first surface and a second surface and electromagnetic interference (EMI) absorbing material on at least a portion of at least one of the first surface and the second surface of the substrate. The integrated circuit chip is electrically connected to the substrate. The substrate is connected to a printed circuit board. A lid is connected to the integrated circuit chip, the substrate, and the printed circuit board. A periphery of the lid comprises a side skirt circumscribing the integrated circuit chip and the substrate. The connecting of the lid comprises depositing EMI absorbing material on the printed circuit board, and embedding the side skirt in the EMI absorbing material.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
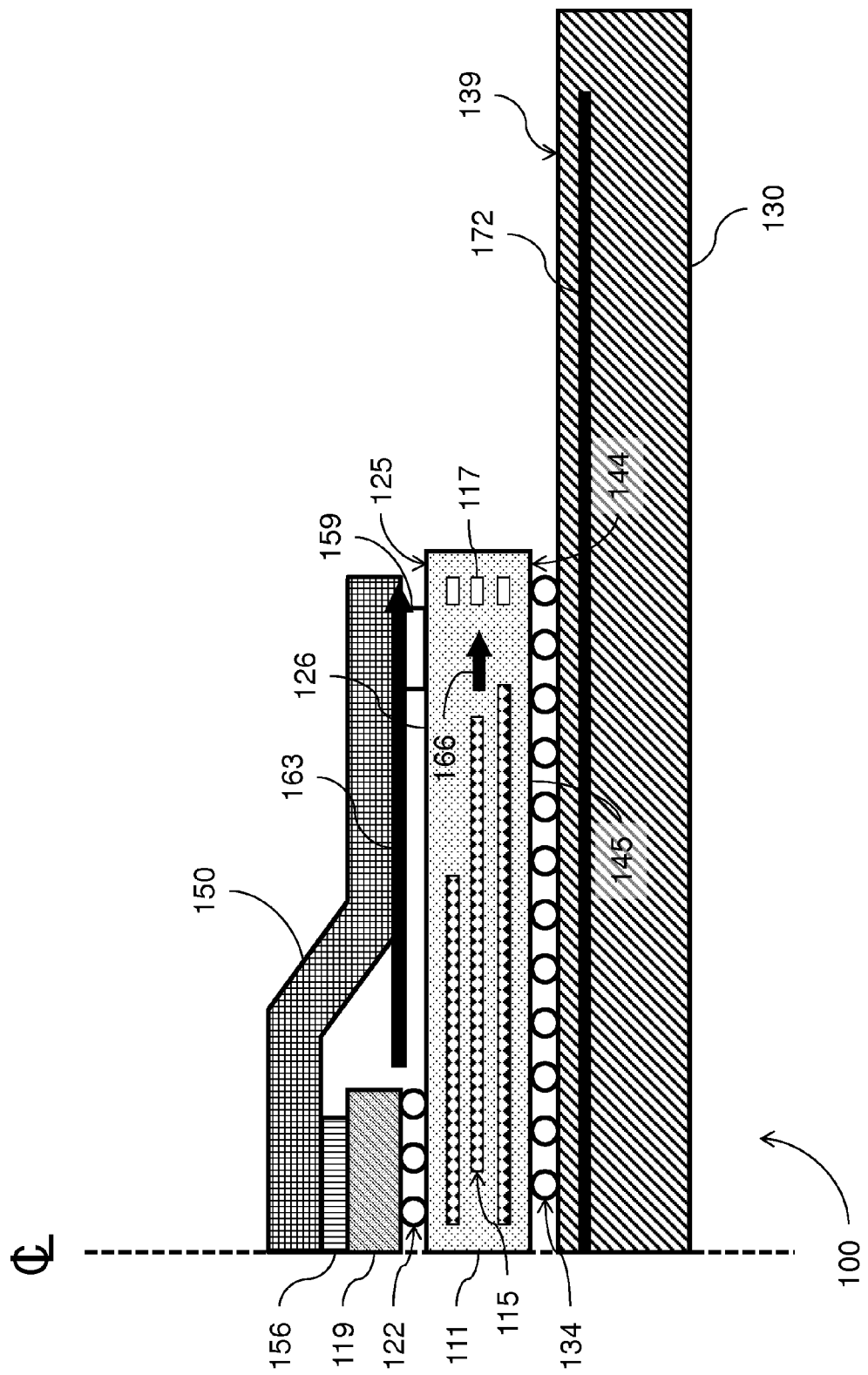
FIG. 1 is a cross-sectional view of a package structure illustrating devices and methods herein.

FIG. 1 is a vertical cross-section view of a typically packaged electronic device, indicated generally as 100, taken about the centerline of the package. The electronic device 100 includes a laminate substrate 111 with electrical circuit wiring 115 thereon and ground band 117. The ground band 117 is located around the perimeter of each signal plane within the laminate substrate 111. The ground band 117 may be segmented in order to enhance flexibility of the laminate substrate 111 so as to reduce laminate damage (cracking, deformation etc.). A ground band 117 that is segmented and laminated may be constructed with electrical circuit wiring 115 in lines that overlap in order to prevent escape apertures for electromagnetic interference (EMI) radiation within the laminate substrate 111. The laminate substrate 111 may also include EMI absorbing material on at least a portion of the top and/or bottom of the laminate substrate 111. For example, the EMI absorbing material may be included as a solder mask 126 on a first surface 125 of laminate substrate 111 and/or as a solder mask 145 on a second surface 144 of laminate substrate 111.

EMI absorbing material is sometimes referred to as EMI lossy material, which is a material that dissipates electromagnetic energy passing through it. More specifically, EMI lossy material can include a ferrite-like material mixed in an elastomer, such as a resin binder; a lossy filler material, such as carbon powder mixed in an open-celled reticulated foam; electrically conductive materials, carbon, iron, carbonyl iron powder, sendust, ferrites, iron silicide, magnetic alloys, magnetic flakes, steel wool, and combinations thereof; carbon-impregnated rubber; ferrite in a plastic stranded carrier; metal foils; metal clad materials including iron, nickel, and iron/nickel compositions; paste composites selected from the group consisting of iron, nickel, copper with epoxy, lacquer binders; etc. The lossy material can be configured in sheet form or in a liquid form for coating a substrate.

At least one integrated circuit chip 119 is mounted on the laminate substrate 111. Mounting of the integrated circuit chip 119 may be done with a plurality of electrically conductive circuit members 122 positioned on the first surface 125 of the laminate substrate 111. The electrically conductive circuit members 122 may include controlled collapse chip connectors (C4s) or other devices known in the art. The electronic device 100 may include a single integrated circuit chip 119 or multiple chips. The laminate substrate 111 may be mounted onto a printed circuit board 130 by means of a ball grid array 134 or other means known in the art. As shown in FIG. 1, the ball grid array 134 is located between a mounting surface 139 of the printed circuit board 130 and the second surface 144 of the laminate substrate 111. The printed circuit board 130 provides module to module interconnect plus access to Input/Output devices.

The electronic device 100 may also include a lid 150, which is typically used to control substrate flexure and damage, but also provides a heat spreader for thermal management. According to devices and methods herein, the lid 150 may be made of or coated with a material that absorbs or dissipates magnetic fields. The lid 150 may be bonded to the integrated circuit chip 119 through thermal interface material 156 and to the laminate substrate 111 through a grounding path 159.

Various adhesive patterns may be used to bond the lid 150 to the laminate substrate 111. An electrically conductive adhesive, such as a metal filled adhesive, may be used to make this connection through the grounding path 159. The grounding path 159 can ground the lid 150 with some success at controlling EMI radiation. However, as module performance has increased, the effectiveness of controlling the EMI radiation has decreased, so further improvement are disclosed herein to minimize escaped EMI radiation.

FIG. 1 shows electromagnetic radiation sources in the electronic device 100 and potential escape routes. The EMI die leakage path from the integrated circuit chip 119 is indicated by arrow 163 and the EMI substrate leakage path from the laminate substrate 111 is indicated by arrow 166.

Even though there is a grounding path 159 attaching the lid 150 to the laminate substrate 111, there may be openings or apertures that allow radiation to escape through the EMI die leakage paths. An EMI escape path can occur between the ground band 117 and the grounding/reference plane 172 within the printed circuit board 130.

Figure 2:
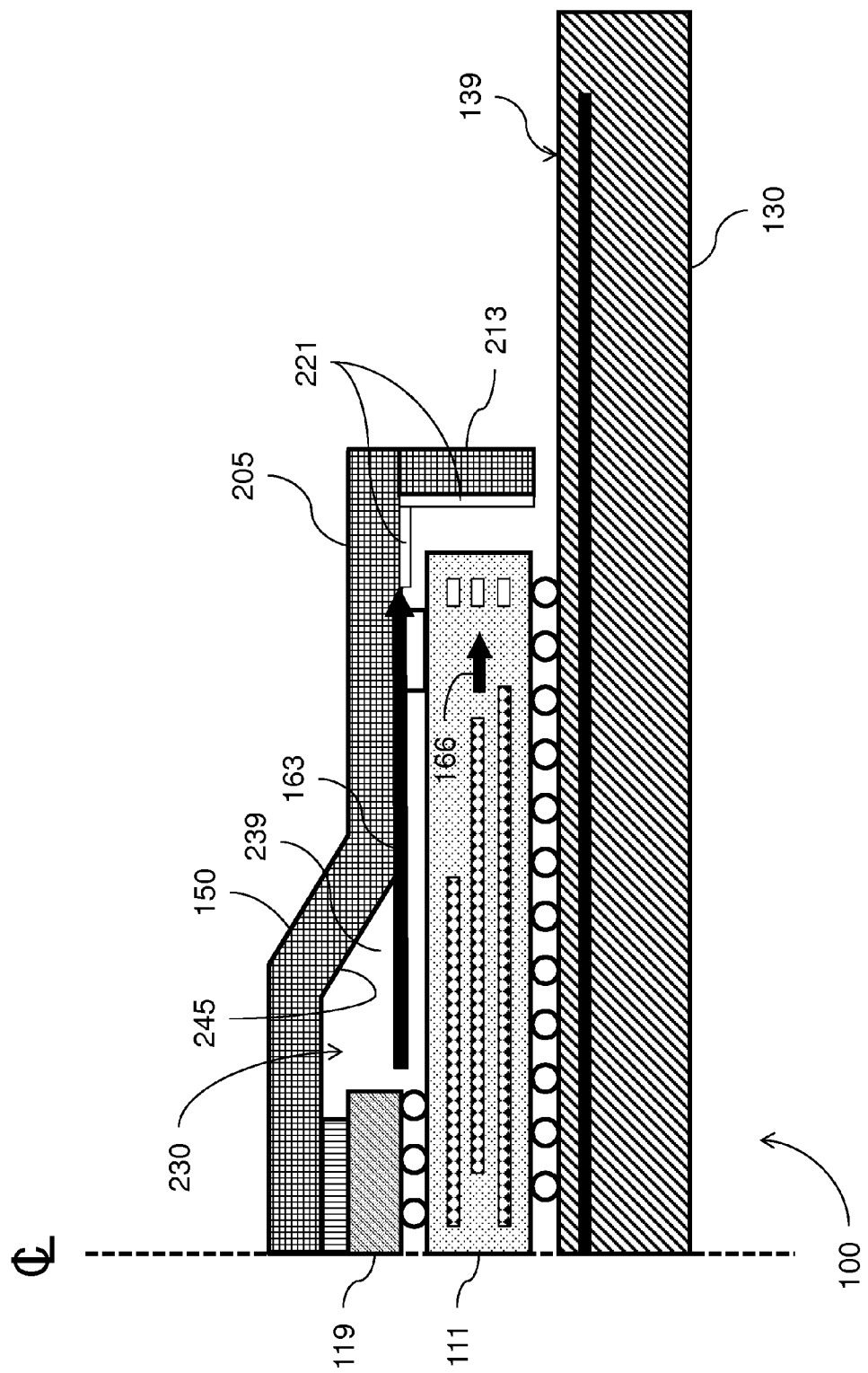
FIG. 2 is a cross-sectional view of a package structure illustrating devices and methods herein.

FIG. 2 shows an extension 205 of the lid 150 that includes a side skirt 213. An EMI absorbing coating 221 may be provided on an inner surface of the extension 205 and the side skirt 213. EMI absorbing material can include, for example, magnetic or conductive metal; Mu-metal; carbon felt; an at least partially conductive or metalized reticulated foam structure; metallic silver; carbonyl iron powder; alloys containing, for example iron, silicon, and aluminum; ferrites; iron silicide; magnetic alloys; magnetic flakes; etc.

The EMI absorbing coating 221 and side skirt 213 prevent direct EMI radiation escape from both the die leakage path, indicated by arrow 163, and the substrate leakage path, indicated by arrow 166, by providing a line-of-site grounded obstacle. The side skirt 213 prevents direct radiation emissions escaping from a grounded lid-to-laminate gap and from the edges of signal layers within the laminate substrate 111 by absorbing the EMI radiation. The EMI absorbing coating 221 increases the efficacy of the EMI shielding of the lid 150.

As shown in FIG. 2, a cavity 230 may exist between the lid 150 and the laminate substrate 111. According to devices and methods herein, a fill material 239 may be provided in the cavity 230. The fill material 239 may be an EMI absorbing material. The fill material 239 may be placed around the integrated circuit chip 119 and around or over package capacitors, if any. Alternatively, the fill material 239 can be pre-coated or applied to an inner surface 245 of the lid 150.

Figure 3:
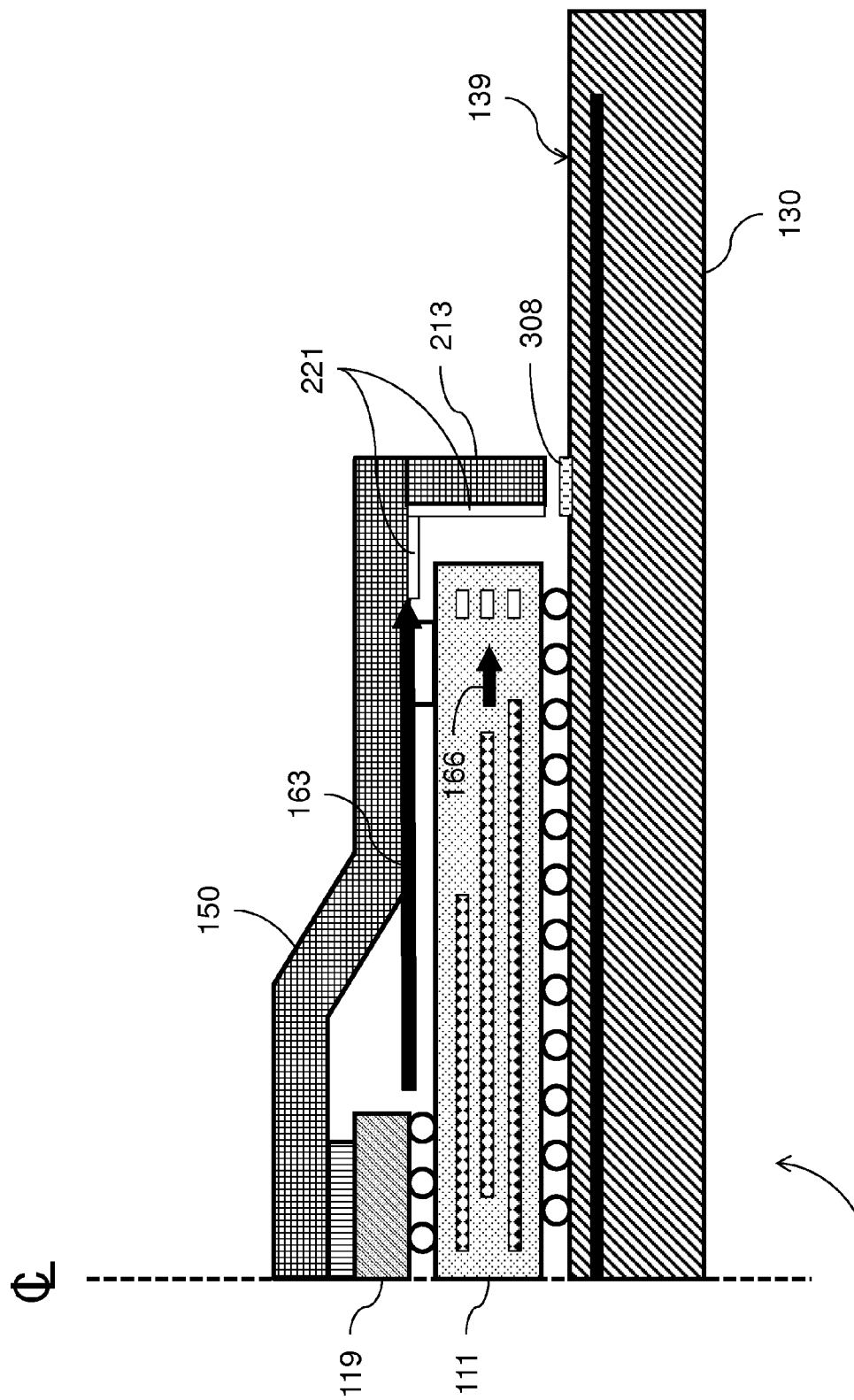
FIG. 3 is a cross-sectional view of a package structure illustrating devices and methods herein.
Figure 4:
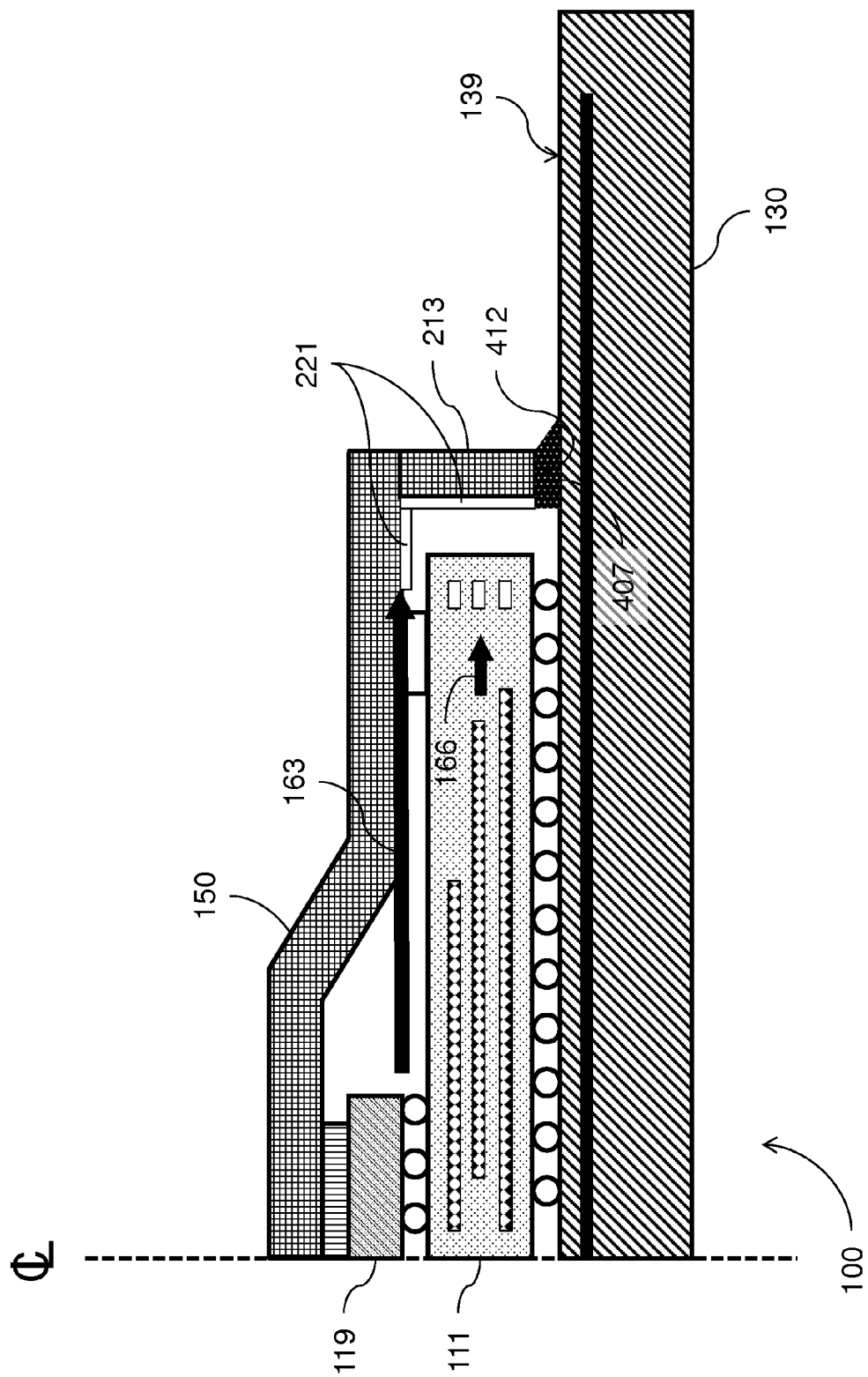
FIG. 4 is a cross-sectional view of a package structure illustrating devices and methods herein.
Figure 5:
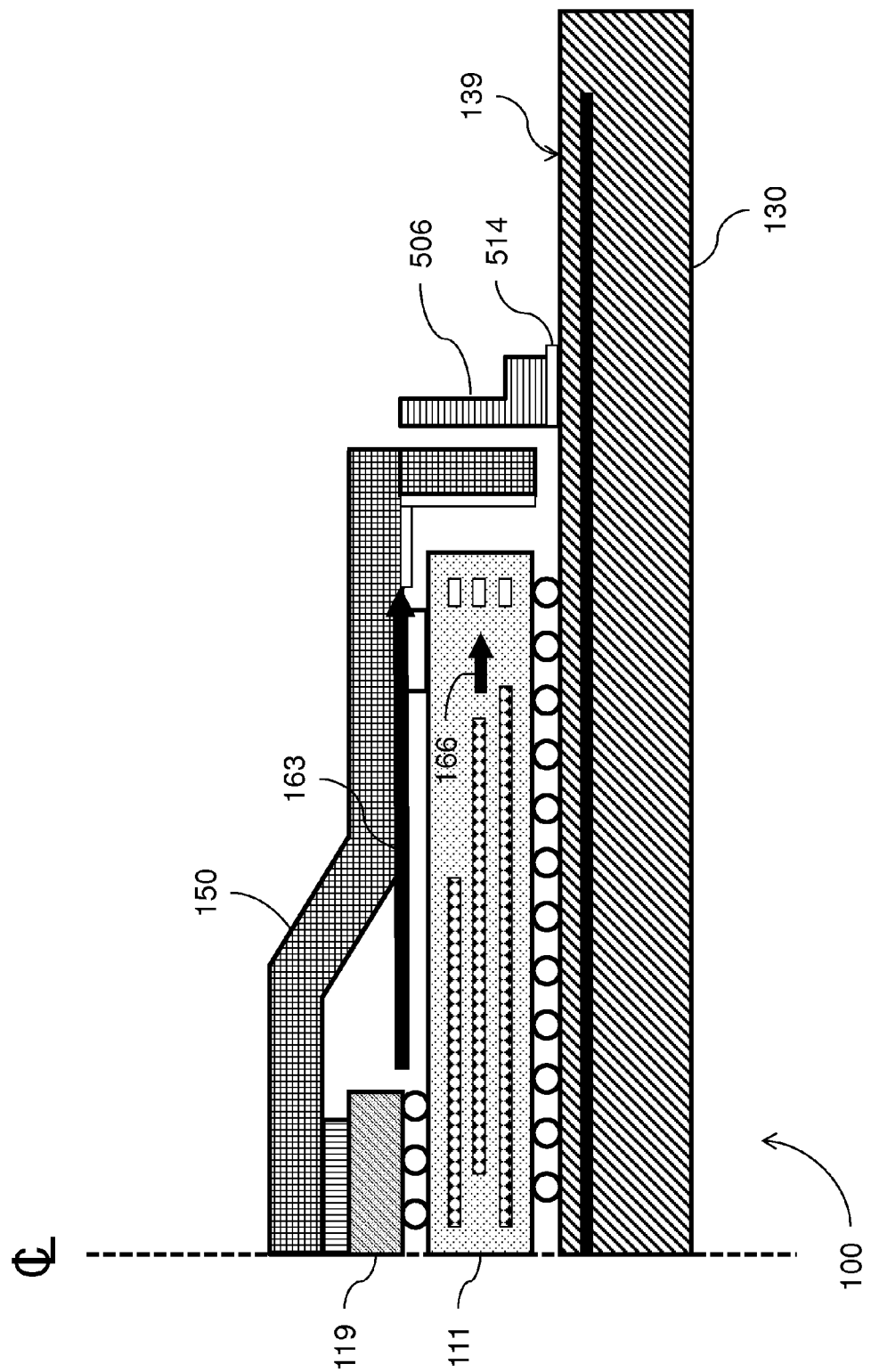
FIG. 5 is a cross-sectional view of a package structure illustrating devices and methods herein.

FIGS. 3 through 5 illustrate shield enhancements addressing the small gap between the side skirt 213 and the mounting surface 139 of the printed circuit board 130.

As shown in FIG. 3, a surface ground trap 308 may be added to the mounting surface 139 of the printed circuit board 130. The surface ground trap 308 is located in line with the side skirt 213 and helps to prevent direct radiation emissions escaping from the edges of signal layers within the laminate substrate 111.

FIG. 4 shows EMI absorbing material 407 positioned on the mounting surface 139 of the printed circuit board 130. The EMI absorbing material 407 is arranged between an edge 412 of the side skirt 213 and the mounting surface 139 of the printed circuit board 130. The edge 412 of the side skirt 213 may be embedded in the EMI absorbing material 407. In some devices disclosed herein, the EMI absorbing material 407 may be positioned on the surface ground trap 308 described above.

In FIG. 5, an EMI radiation absorbing wall 506 may be provided on the mounting surface 139 of the printed circuit board 130 adjacent to the side skirt 213. The EMI radiation absorbing wall 506 may be positioned on a surface ground trap 514 that is added to the mounting surface 139 of the printed circuit board 130.

Devices described herein can use various combinations of the enhancements illustrated in FIGS. 2 through 5. The apparatus and methods described herein enable the reduction of escaped radiation at frequencies in the GHz range.

Figure 6:
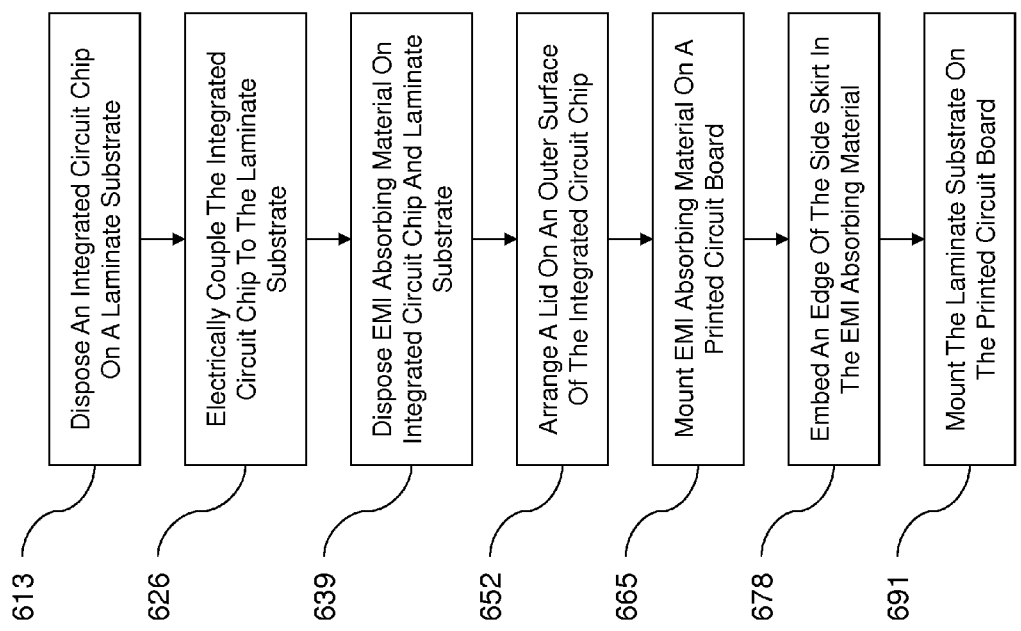
FIG. 6 is a flow diagram illustrating methods herein.

FIG. 6 is a flow diagram illustrating the processing flow of an exemplary method of fabricating an electronic package incorporating shielding against emissions of electromagnetic interference (EMI) according to devices and methods herein.

In item 613, an integrated circuit chip is disposed on a surface of a laminate substrate. The laminate substrate has a first surface and a second surface and EMI absorbing material on at least a portion of at least one of the first surface and the second surface of the laminate substrate. The integrated circuit chip is electrically coupled to the laminate substrate, at 626. EMI absorbing material is disposed on the integrated circuit chip and the laminate substrate, at 639. A lid is arranged on an outer surface of the integrated circuit chip, at 652. The lid is positioned away from the surface of the laminate substrate and covers the integrated circuit chip and the laminate substrate. The lid includes a side skirt circumscribing the integrated circuit chip and the laminate substrate. In item 665, EMI absorbing material is mounted on a printed circuit board. The EMI absorbing material is arranged between an edge of the side skirt and a mounting surface of the printed circuit board. In item 678, the edge of the side skirt is embedded in the EMI absorbing material. The laminate substrate is then mounted on the printed circuit board, at 691.

Figure 7:
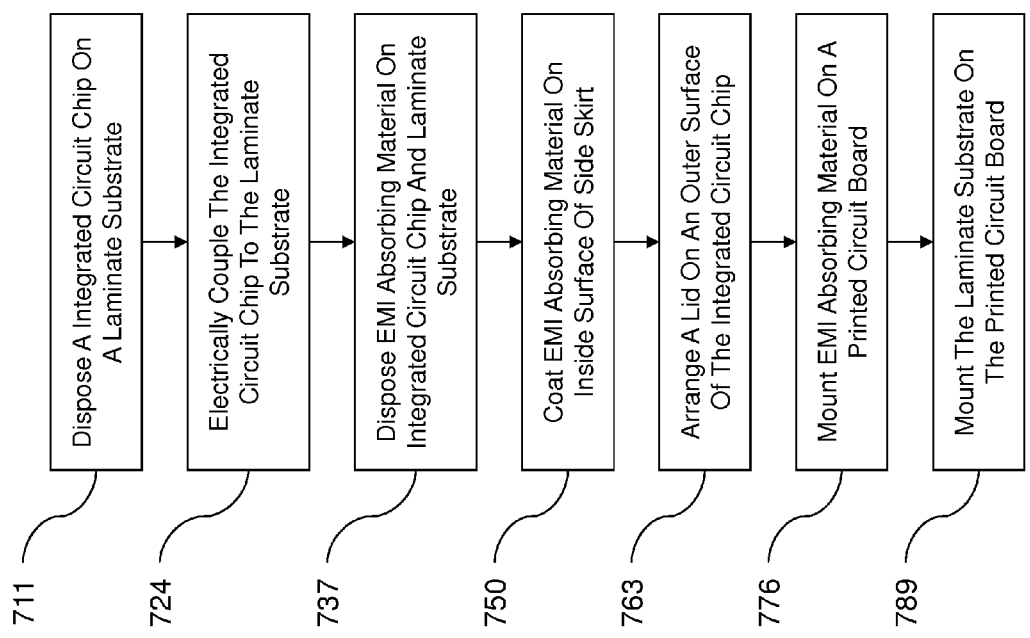
FIG. 7 is a flow diagram illustrating methods herein.

FIG. 7 is another flow diagram illustrating the processing flow of an alternate method of fabricating an electronic package incorporating shielding against emissions of electromagnetic interference (EMI) according to devices and methods herein. In item 711, an integrated circuit chip is disposed on a surface of a laminate substrate. The integrated circuit chip is electrically coupled to the laminate substrate, at 724. EMI absorbing material is disposed on the integrated circuit chip and the laminate substrate, at 737. In item 750, a side skirt is coated with EMI absorbing material on an inside surface. The side skirt circumscribes the integrated circuit chip and the laminate substrate. A lid is arranged on an outer surface of the integrated circuit chip, at 763. The lid is positioned away from the surface of the laminate substrate and covers the integrated circuit chip and the laminate substrate. In item 776, EMI absorbing material is mounted on a printed circuit board. The EMI absorbing material is arranged between an edge of the side skirt and a surface of the printed circuit board. The laminate substrate is mounted on the printed circuit board, at 789.

The method steps may also be performed in other orders.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

Flip chip is a method for interconnecting semiconductor devices, such as IC chips, to external circuitry with solder bumps that have been deposited onto the chip pads. The solder bumps are deposited on the chip pads on the top of the wafer during the final wafer processing step. In order to mount the chip to external circuitry (e.g., a circuit board or another chip or wafer), it is flipped over so that its top side faces down, and aligned so that its pads align with matching pads on the external circuit, and then the solder is flowed to complete the interconnect. This is in contrast to wire bonding, in which the chip is mounted upright, and wires are used to interconnect the chip pads to external circuitry.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

A hardmask can be formed of any suitable material, whether now known or developed in the future, such as a metal or organic hardmask, that has a hardness greater than the substrate and insulator materials used in the remainder of the structure.

The terminology used herein is for the purpose of describing particular devices and methods only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods of the present disclosure have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

What is claimed is:

1. A method, comprising:
    connecting an integrated circuit chip to a first surface of a substrate, said substrate having a second surface opposite said first surface and electromagnetic interference (EMI) absorbing material directly contacting at least a portion of at least one of said first surface and said second surface;
    electrically connecting said integrated circuit chip to said substrate;
    connecting said second surface of said substrate to a printed circuit board; and
    connecting a lid to said integrated circuit chip, said first surface of said substrate, and said printed circuit board, a periphery of said lid comprising a side skirt, said side skirt circumscribing said integrated circuit chip and said substrate, said connecting of said lid comprising:
        depositing a portion of EMI absorbing material on said printed circuit board so as to circumscribe said substrate; and
        embedding a portion of said side skirt in said portion of EMI absorbing material.

2. The method according to claim 1, further comprising:
    coating on an inner surface of said side skirt and at least a portion of said lid with an EMI absorbing coating.

3. The method according to claim 1, further comprising:
    connecting a surface ground trap to said printed circuit board.

4. The method according to claim 3, said surface ground trap being located in line with said side skirt.

5. The method according to claim 3, further comprising:
    connecting an EMI radiation absorbing wall to a top surface of said surface ground trap, said EMI radiation absorbing wall being positioned laterally adjacent to, but physically separated from, said side skirt.

6. The method according to claim 1, further comprising:
    depositing a fill material within a cavity formed between said lid and said substrate, said fill material comprising an EMI absorbing material.

7. A method, comprising:
    providing a substrate on a printed circuit board, said substrate having a first surface and a second surface and electromagnetic interference (EMI) absorbing material directly contacting at least a portion of at least one of said first surface and said second surface of said substrate;
    mounting an integrated circuit chip on said substrate;
    electrically connecting said integrated circuit chip to said substrate; and
    covering said integrated circuit chip and said substrate with an EMI shielding unit, said EMI shielding unit comprising:
        a lid covering said integrated circuit chip and portions of said substrate outside said integrated circuit chip;
        a periphery of said lid comprising a side skirt, said side skirt circumscribing said integrated circuit chip and said substrate; and
        EMI absorbing material attached to an inner surface of said side skirt and at least a portion of an inner surface of said lid; and,
    attaching a portion of EMI absorbing material to said printed circuit board; and
    embedding a portion of said side skirt in said portion of EMI absorbing material.

8. The method according to claim 7, said EMI absorbing material directly contacting said at least a portion of said at least one of said first surface and said second surface of said substrate comprising a solder mask.

9. The method according to claim 7, further comprising:
    attaching a surface ground trap to a mounting surface of said printed circuit board.

10. The method according to claim 9, said surface ground trap being located in line with said side skirt.

11. The method according to claim 9, further comprising:
    connecting an EMI radiation absorbing wall to said surface ground trap, said EMI radiation absorbing wall being positioned adjacent to said side skirt.

12. The method according to claim 7, further comprising:
    depositing a fill material within a cavity formed between said lid and said substrate, said fill material comprising an EMI absorbing material.

13. A method of building an electronics package, said method comprising:
    providing a substrate having a first surface and a second surface opposite said first surface:
    connecting an integrated circuit chip to said first surface of said substrate;
    attaching a plurality of electrically conductive circuit members to said first surface of said substrate and electrically connecting said electrically conductive circuit members to said integrated circuit chip;
    providing a printed circuit board having a mounting surface;
    connecting said second surface of said substrate to said mounting surface of said printed circuit board; and
    covering said integrated circuit chip and portions of said substrate outside said integrated circuit chip with a lid, said lid comprising a side skirt around a periphery of said lid, said side skirt circumscribing said integrated circuit chip and said substrate, electromagnetic interference (EMI) absorbing material being attached to an inner surface of said side skirt and at least a portion of an inner surface of said lid,
    at least a portion of at least one of said first surface and said second surface of said substrate having EMI absorbing material directly connected thereto.

14. The method according to claim 13, further comprising:
    providing a portion of EMI absorbing material contacting said printed circuit board; and embedding a portion of said side skirt in said portion of EMI absorbing material.

15. The method according to claim 13, further comprising: attaching a surface ground trap to a mounting surface of said printed circuit board.

16. The method according to claim 15, said surface ground trap being located in line with said side skirt.

17. The method according to claim 15, further comprising: connecting an EMI radiation absorbing wall to said surface ground trap, said EMI radiation absorbing wall being positioned adjacent to said side skirt.

18. The method according to claim 13, further comprising: depositing a fill material within a cavity formed between said lid and said substrate, said fill material comprising an EMI absorbing material.

* * * * *